United States Patent
Song et al.

(10) Patent No.: US 8,604,465 B2
(45) Date of Patent: Dec. 10, 2013

(54) ORGANIC LIGHT-EMITTING DIODE DISPLAY DEVICE AND METHOD OF MANUFACTURING THE SAME

(75) Inventors: Seung-Yong Song, Yongin (KR); Young-Seo Choi, Yongin (KR); Jin-Hwan Jeon, Yongin (KR); Oh-June Kwon, Yongin (KR); Sun-Young Jung, Yongin (KR); Charles Joo, Yongin (KR); Ji-Hun Ryu, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 295 days.

(21) Appl. No.: 13/064,501

(22) Filed: Mar. 29, 2011

(65) Prior Publication Data
US 2012/0037916 A1   Feb. 16, 2012

(30) Foreign Application Priority Data
Aug. 10, 2010 (KR) .......... 10-2010-0076968

(51) Int. Cl.
*H01L 35/24* (2006.01)

(52) U.S. Cl.
USPC .... 257/40; 257/7; 257/E27.001; 257/E51.001

(58) Field of Classification Search
USPC ............... 257/72, E27.001, 40, E51.001
See application file for complete search history.

(56) References Cited

U.S. PATENT DOCUMENTS

| 7,042,444 B2 | 5/2006 | Cok |
| 7,071,540 B2 | 7/2006 | Lyu et al. |

FOREIGN PATENT DOCUMENTS

| KR | 10-026075 B1 | 4/2000 |
| KR | 10 2000-0042830 A | 7/2000 |
| KR | 10 2004-0066728 A | 7/2004 |
| KR | 10 2005-000504 A | 1/2005 |
| KR | 10 2010-0026357 A | 3/2010 |

*Primary Examiner* — Anthony Ho
(74) *Attorney, Agent, or Firm* — Lee & Morse, P.C.

(57) ABSTRACT

An organic light-emitting diode display device includes a substrate, a display unit on the substrate, a touch unit facing the substrate, and a sealing portion surrounding the display unit. The sealing portion couples the substrate to the touch unit and includes glass frit. The touch unit includes an encapsulation substrate, a first conductive layer on the encapsulation substrate, an insulating layer on a portion of the first conductive layer and the encapsulation substrate, and a second conductive layer on the first conductive layer and the insulating layer. The insulating layer of the touch unit includes an organosilicon compound and has a thermal decomposition temperature of about 360° C. or more.

15 Claims, 3 Drawing Sheets

ORGANIC LIGHT-EMITTING DIODE DISPLAY DEVICE AND METHOD OF MANUFACTURING THE SAME

BACKGROUND

1. Field

Embodiments relate to an organic light-emitting diode display device and a method of manufacturing the same.

2. Description of the Related Art

Organic light-emitting diode display devices include self-emission devices each including two electrodes and a fluorescent or phosphorescent organic layer interposed between the two electrodes. When a current is provided to the fluorescent or phosphorescent organic layer, electrons and holes may be re-combined in the fluorescent or phosphorescent organic layer, thereby generating light. Since organic light-emitting diode display devices self-emit light, they have wide viewing angles and high contrast ratios. In addition, since organic light-emitting diode display devices do not require a backlight, they can be manufactured as thin and lightweight devices and have low power consumption.

An organic light-emitting diode display device may be manufactured by attaching an encapsulation substrate using a sealing portion to a substrate including a display unit for producing an image. There are on-cell or in-cell type organic light-emitting diode display devices in which a circuit or pattern is formed on an encapsulation substrate in order to operate a touch screen so that there is no need to manufacture a glass or plastic substrate for a touch. On-cell or in-cell type organic light-emitting diode display devices have low manufacturing costs and can be manufactured as thin devices. Regarding front-emission type organic light-emitting display devices, a touch unit can be manufactured in an on-cell or in-cell manner.

SUMMARY

Embodiments are therefore directed to an organic light-emitting diode display device and method of manufacturing the organic light-emitting diode display device, which substantially overcome one or more of the problems due to the limitations and disadvantages of the related art.

It is therefore a feature of an embodiment to provide an organic light-emitting diode display device in which heat resistance of an insulating layer of a touch unit of the organic light-emitting diode display device is increased, thereby enabling sealing using glass frit.

It is therefore another feature of an embodiment to provide a method of manufacturing the organic light-emitting diode display device that enables sealing using glass frit.

At least one of the above and other features and advantages may be realized by providing an organic light-emitting diode display device including a substrate; a display unit formed on the substrate; a touch unit disposed facing the substrate; and a sealing portion surrounding the display unit, coupling the substrate to the touch unit, and including glass frit. Wherein the touch unit includes an encapsulation substrate, a first conductive layer formed on a surface of the encapsulation substrate, an insulating layer that is formed on at least a portion of the first conductive layer and the encapsulation substrate and includes an organosilicon compound represented by Formula 1, and a second conductive layer formed on at least a portion of the first conductive layer and the insulating layer, and a thermal decomposition temperature of the insulating layer is 360° C. or more.

Formula 1 is represented by the following:

$$HO-\underset{\underset{R_2}{|}}{\overset{\overset{R_1}{|}}{Si}}-\underset{\underset{R_2}{|}}{\overset{\overset{O}{|}}{O}}-\left[\underset{\underset{R_4}{|}}{\overset{\overset{R_3}{|}}{Si}}-\underset{\underset{R_4}{|}}{\overset{\overset{O}{|}}{O}}\right]_n-OH$$

Wherein n is an integer from 1 to 7, and $R_1$ through $R_4$ are each independently one of H, $CH_3$, $C_2H_5$, or $C_3H_7$.

A visible light transmittance of the insulating layer may be 95% or more.

A dielectric ratio of the insulating layer may be 3.3 or less.

A shore D hardness of the insulating layer may be in the range of 90 to 95.

In Formula 1, at least one of $R_1$ to $R_4$ may be a hydrogen atom.

The organosilicon compound may be an organosilicon compound represented by Formula 2.

Formula 2 is represented by the following:

$$HO-\underset{\underset{H}{|}}{\overset{\overset{H}{|}}{Si}}-\underset{\underset{H}{|}}{\overset{\overset{O}{|}}{O}}-\left[\underset{\underset{H}{|}}{\overset{\overset{H}{|}}{Si}}-\underset{\underset{H}{|}}{\overset{\overset{O}{|}}{O}}\right]_n-OH$$

Wherein n is an integer from 1 to 7.

The organosilicon compound may be an organosilicon compound represented by Formula 2 and a thermal decomposition temperature of the insulating layer is 400° C. or more.

A visible light transmittance of the insulating layer may be 97% or more.

The first conductive layer and the second conductive layer includes each independently Mo, W, Cr, ITO, IZO, ZnO, AZO, $In_2O_3$, or a combination thereof.

The first conductive layer may be formed on a surface of the encapsulation substrate opposite to another surface facing the display unit.

The display unit includes an emission unit and a non-emission unit, and the first conductive layer, the second conductive layer, and the insulating layer may be formed corresponding to the non-emission unit.

The display unit includes thin film transistors formed on the substrate and an organic light-emitting device coupled to the thin film transistors. Wherein the organic light-emitting device includes a first electrode, a second electrode, and an organic layer interposed between the first electrode and the second electrode.

The touch unit may be an electrostatic capacity type touch unit.

The organic light-emitting diode display device may further include a polarizing plate disposed on the touch unit.

The organic light-emitting diode display device may be a front emission type organic light-emitting diode display device.

At least one of the above and other features and advantages may also be realized by providing a method of manufacturing an organic light-emitting diode display device. The method includes forming a display unit on a substrate; forming a first conductive layer, an insulating layer including an organosilicon compound represented by Formula 1 below, and a second conductive layer on an encapsulation substrate; forming a sealing portion including glass fit on an edge of the encapsulation substrate; and sealing the substrate and the encapsulation substrate:

Formula 1 is represented by the following:

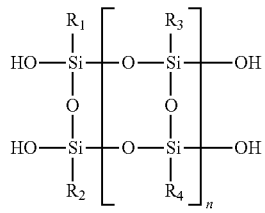

Wherein n is an integer from 1 to 7, and $R_1$ through $R_4$ are each independently one of H, $CH_3$, $C_2H_5$, or $C_3H_7$.

The forming of the sealing portion includes coating glass frit and sintering the coated glass frit.

A sintering temperature of the glass frit may be in the range of 300 to 500° C.

The sealing may include coupling the substrate to the encapsulation substrate by melting the sealing portion by irradiation of a laser or ultraviolet rays.

The forming of the insulating layer may include coating a solution including the organosilicon compound of Formula 1 and a hydrochloric acid in a mole ratio of 200:1 to 50:1 to form a coating layer, and heat treating the coating layer at a temperature of 200 to 400° C.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1A:
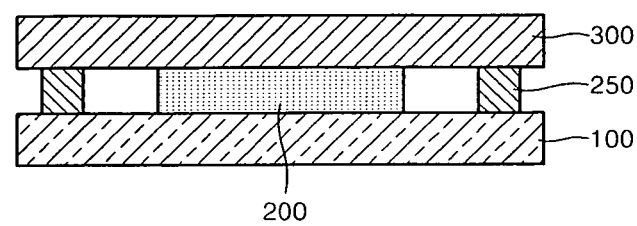
FIG. 1A illustrates a schematic sectional view of an organic light-emitting diode display device according to an exemplary embodiment.

Korean Patent Application No. 10-2010-0076968, filed on Aug. 10, 2010, in the Korean Intellectual Property Office, and entitled: "Organic Light-Emitting Diode Display Device and Method of Manufacturing the Same," is incorporated by reference herein in its entirety.

Reference will now be made in detail to exemplary embodiments, examples of which are illustrated in the accompanying drawings. However, exemplary embodiments are not limited to the embodiments illustrated hereinafter, and the embodiments herein are rather introduced to provide easy and complete understanding of the scope and spirit of exemplary embodiments.

In the drawings, the thicknesses of layers and regions are exaggerated for clarity. Like reference numerals refer to like elements throughout. It will be understood that when an element, such as a layer, a film, a region, or a substrate, is referred to as being "on," it may be directly on the other element or intervening elements may be present. In addition, it will also be understood that when a layer is referred to as being "between" two layers, it can be the only layer between the two layers, or one or more intervening layers may also be present. Like reference numerals refer to like elements throughout.

Figure 1B:
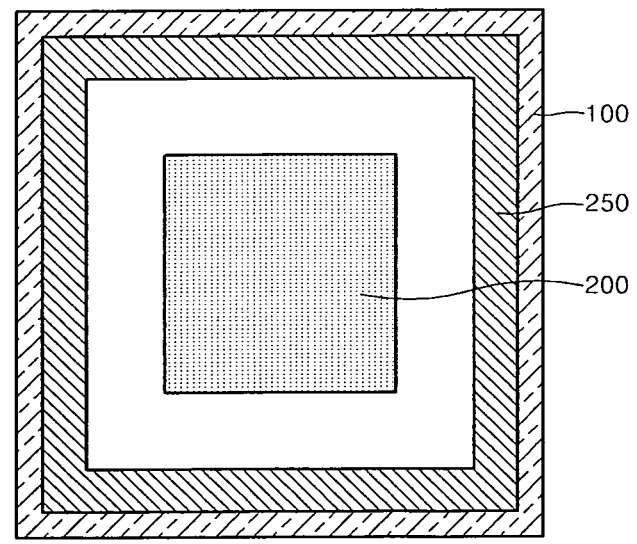
FIG. 1B illustrates a schematic plan view of the organic light-emitting diode display device of FIG. 1A.
Figure 2:
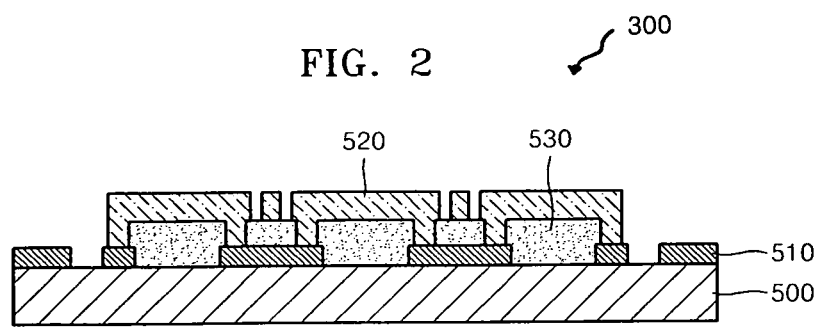
FIG. 2 illustrates a schematic sectional view of a touch unit of an organic light-emitting diode display device, according to an exemplary embodiment.

FIG. 1A illustrates a schematic sectional view of an organic light-emitting diode display device according to an exemplary embodiment, and FIG. 1B illustrates a schematic plan view of the organic light-emitting diode display device of FIG. 1A. For ease of understanding, a touch unit 300 illustrated in FIG. 1A is not illustrated in FIG. 1B. FIG. 2 illustrates a schematic sectional view of the touch unit 300 of an organic light-emitting diode display device, according to an exemplary embodiment.

Referring to FIGS. 1A, 1B, and 2, the organic light-emitting diode display device includes a substrate 100, a display unit 200 formed on the substrate 100, a touch unit 300 facing the substrate 100, and a sealing portion 250 surrounding the display unit 200 and coupling the substrate 100 and the touch unit 300. The touch unit 300 includes an encapsulation substrate 500, a first conductive layer 510 formed on the encapsulation substrate 500, an insulating layer 530 formed on at least a portion of the first conductive layer 510 and the encapsulation substrate 500, and a second conductive layer 520 formed on at least a portion of the first conductive layer 510 and the insulating layer 530.

The sealing portion 250 may be formed of glass frit. When glass frit is used, the lifetime of the organic light-emitting diode display device may be improved. Without intending to be bound by this theory, when an organic sealant, an inorganic sealant, or an organic and inorganic composite sealant is used instead of glass frit, it is difficult to place a water-absorbing agent inside the organic light-emitting diode display device. Thus the lifetime of the organic light-emitting diode display device may be reduced and the substrate 100 or the encapsulation substrate 500 may need to be separately processed in order to load the water-absorbing agent inside the organic light-emitting diode display device.

For example, touch units may include an acryl-based material or an inorganic insulating material forming an insulating layer therein. When the acryl-based material is used, it may not be possible or may be difficult to also use a water-absorbing agent. However, lifetimes of organic light-emitting diode display devices using the acryl-based material may be reduced when the water-absorbing agent is excluded. Further, even when a water-absorbing agent is used, an encapsulation substrate may need to be processed separately, thereby the manufacturing costs are increased and the yield is reduced. When the inorganic insulating layer formed of, e.g., SiOx or SiNx, is used, it may be difficult to form a thick inorganic insulating layer, the process time may be increased, layer deformation may occur due to a layer stress resulting from the formation of a thick layer, and a substrate may be bent or broken due to stress of an encapsulation substrate.

The insulating layer 530 may include, e.g., an organosilicon compound represented by Formula 1 below:

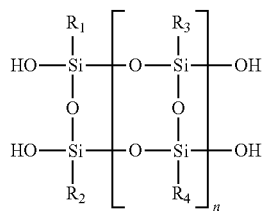

<Formula 1>

Wherein n is an integer from 1 to 7, $R_1$ through $R_4$ may each be one of H, $CH_3$, $C_2H_5$, and $C_3H_7$, independently of each other, and n groups of $R_3$ and n groups of $R_4$ may be identical to or different from each other. The integer n may be within a narrower range, e.g., the narrower range may include, but is not limited to, 2 to 7, 3 to 7, 4 to 7, 5 to 7, 6 to 7, 2 to 6, etc.

The insulating layer 530 may be formed of a material with heat resistance. Since glass frit is used to form the sealing portion 250, commercially available acryl-based compounds may not be appropriate for the formation of an insulating layer because they may thermally decompose at a sintering temperature of glass frit. Since the sintering temperature of glass frit is about 350° C. or more, a material that is not decomposed or not deformed at the sintering temperature is used to form the insulating layer 530.

Since a thermal decomposition temperature of the insulating layer 530 including the organosilicon compound represented by Formula 1 is 360° C. or more, the decomposition of the insulating layer 530 at the sintering temperature of the glass frit may not, e.g., may not substantially, occur. As such, the insulating layer 530 is essentially not decomposed or deformed by the sintering temperature of the glass frit. For example, the thermal decomposition temperature of the insulating layer 530 including the organosilicon compound represented by Formula 1 may be in the range of about 360 to 500° C. The thermal decomposition temperature of the insulating layer 530 may be within a narrower range, e.g., the narrower range may include, but is not limited to, about 400 to 500° C.

The organosilicon compound of Formula 1 has a high heat resistance due to, e.g., its network structure. Also, in the organosilicon compound of Formula 1, each of $R_1$ through $R_4$ may be a hydrogen atom or an alkyl group. Without intending to be bound by this theory, the smaller the number of carbons in the alkyl group, the higher the heat resistance. For example, in Formula 1, when at least one of $R_1$ through $R_4$ is a hydrogen atom, a higher heat resistance may be obtained than when $R_1$ through $R_4$ all are alkyl groups. In particular, when, in Formula 1, $R_1$ through $R_4$ all are hydrogen atoms, the highest heat resistance of the organosilicon compound may be obtained.

If an insulating layer is formed of an inorganic material, such as SiOx or SiNx, it may be difficult to form a thick insulating layer. Further, even when a thick insulating layer is formed, process time may be increased, layer quality may be changed due to, e.g., stress resulting from the formation of the thick layer, and/or the organic light-emitting diode display device including the insulating layer may be bent or broken due to, e.g., stress of the encapsulation substrate 500. The insulating layer 530 including the organosilicon compound of Formula 1 has a high heat resistance and may be formed by coating, such that even when the insulating layer 530 is formed as a thick layer, layer quality may not be changed.

The substrate 100 may be formed of a transparent glass material mainly composed of $SiO_2$. However, a material for forming the substrate 100 is not limited thereto, and the substrate 100 may be instead formed of a transparent plastic material. The transparent plastic material for forming the substrate 100 may be an insulating organic material, and may be, e.g., polyethersulphone (PES), polyacrylate (PAR), polyetherimide (PEI), polyethyelene naphthalate (PEN), polyethyelene terepthalate (PET), polyphenylene sulfide (PPS), polyallylate, polyimide, polycarbonate (PC), cellulose tri acetate (TAC), and cellulose acetate propionate (CAP).

If the organic light-emitting diode display device is a bottom-emission type organic light-emitting diode display device, and an image is produced toward the substrate 100, the substrate 100 is preferably a transparent material. If the organic light-emitting diode display device is a front-emission type organic light-emitting diode display device, and an image is produced in a direction away from the substrate 100, the substrate 100 may not necessarily be formed of a transparent material, e.g., the substrate 100 may be formed of a metal. When the substrate 100 is formed of a metal, the substrate 100 may include at least one of, e.g., carbon, iron, chromium, manganese, nickel, titanium, molybdenum, stainless steel (SUS), Invar alloy, Inconel alloy, and Kovar alloy. However, a material for forming the substrate 100 is not limited thereto, e.g., the substrate 100 may be instead formed of a metal foil.

A buffer layer (not shown) may be further formed on a top surface of the substrate 100 so as to, e.g., planarize the substrate 100 and prevent permeation of impurity elements into the substrate 100.

The display unit 200 formed on the substrate 100 may include an organic light-emitting device. A detailed description of the display unit 200 will be presented later.

The substrate 100 may have thereon the display unit 200 coupled to the encapsulation substrate 500, and the encapsulation substrate 500 may be placed above the display unit 200. The encapsulation substrate 500 may be, e.g., a glass substrate, a metal substrate, or a plastic substrate, such as an acryl substrate.

The substrate 100 may be coupled to the encapsulation substrate 500 with the sealing portion 250 in such a manner that the display unit 200 is interposed between the substrate 100 and the encapsulation substrate 500. The sealing portion 250 may be formed of glass frit.

The first conductive layer 510, the second conductive layer 520, and the insulating layer 530 may be formed on the encapsulation substrate 500. The insulating layer 530 includes, e.g., the organosilicon compound of Formula 1.

In order to couple the substrate 100 to the encapsulation substrate 500 with the sealing portion 250, glass fit may be coated on a portion of the encapsulation substrate 500 and sintered. In this regard, the sintering temperature of the glass frit is, e.g., in the range of about 300 to 500° C. and the insulating layer 530 is not decomposed in the sintering temperature range. The sintering temperature of the glass frit may be within a narrower range, e.g., the narrower range includes, but is not limited to, about 350 to 500° C. and about 400 to 500° C.

The insulating layer 530 including the organosilicon compound of Formula 1 may be formed by coating a solution including the organosilicon compound of Formula 1 on the encapsulation substrate 500 and heat treating the coating layer at a temperature of, e.g., about 200 to 400° C. For example, a solution prepared by adding a hydrochloric acid to a silsesquioxane including hydrogen or alkyl may be coated on the encapsulation substrate 500 and then the coating layer is heated at a temperature of about 250° C.

The insulating layer 530 including the organosilicon compound of Formula 1 has a thermal decomposition temperature and correspondingly a high heat resistance, and is able to be formed by coating and thus formed as a thick layer.

The insulating layer 530 including the organosilicon compound of Formula 1 may have a visible light transmittance of about 95% or more. The organic light-emitting diode display device including the touch unit 300 preferably has high visible light transmittance. If the visible light transmittance is equal to or greater than 95%, the organic light-emitting diode display device including the touch unit 300 may be satisfactorily applied for front-emission.

When the number of carbon atoms of $R_1$ to $R_4$ is increased, the visible light transmittance of the organosilicon compound of Formula 1 may be decreased. The organosilicon compound of Formula 1 may have the highest visible light transmittance when $R_1$ to $R_4$ all are hydrogen atoms. When the number of carbon atoms of $R_1$ to $R_4$ is equal to or greater than 4, the visible light transmittance of the organosilicon compound of Formula 1 may be about 95% or less.

A dielectric ratio of the insulating layer 530 including the organosilicon compound of Formula 1 may be about 3.3 or less. The dielectric ratio of the insulating layer 530 may be evaluated by the following Equation 1 using a thickness of the insulating layer 530 measured by, e.g., a prism coupler:

$$k = C \times d / \in o \times A \qquad \text{<Equation 1>}$$

Wherein, k is a dielectric ratio, C is a capacitance, $\in o$ is a dielectric constant in a vacuum condition, d is a thickness of a layer having a low dielectric constant, and A is a contact sectional area of an electrode.

If the dielectric ratio of the insulating layer 530 is about 3.3 or less, the insulating layer 530 has a low dielectric ratio and the insulating layer 530 may have excellent mechanical properties and a high heat resistance.

A shore D hardness of the insulating layer 530 including the organosilicon compound of Formula 1 may be in the range of about 90 to 95. If the shore D hardness of the insulating layer 530 is within the range described above, the insulating layer 530 may have excellent mechanical properties.

In the organosilicon compound of Formula 1, at least one of $R_1$ to $R_4$ may be a hydrogen atom. In regard to Formula 1, when at least one of $R_1$ to $R_4$ is a hydrogen atom, the organosilicon compound may have higher heat resistance than when $R_1$ to $R_4$ are each one of $CH_3$, $C_2H_5$, or $C_3H_7$.

The organosilicon compound of Formula 1 may be an organosilicon compound represented by Formula 2 below:

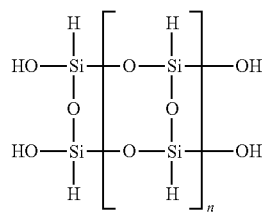

<Formula 2>

Wherein n is an integer from 1 to 7. The integer n may be within a narrower range, e.g., the narrower range may include, but is not limited to, 2 to 7, 3 to 7, 4 to 7, 5 to 7, 6 to 7, 2 to 6, etc.

When the insulating layer 530 includes the organosilicon compound of Formula 2, the insulating layer 530 has a high heat resistance and a thermal decomposition temperature may be about 400° C. or more. For example, the thermal decomposition temperature of the insulating layer 530 may be in the range of about 400 to 500° C. In this regard, the visible light transmittance of the insulating layer 530 is high and, e.g., about 97% or more.

The organosilicon compound of Formula 1 may have a ladder structure. When the organosilicon compound of Formula 1 has the ladder structure, the organosilicon compound has higher heat resistance and may be more stable than when the organosilicon compound of Formula 1 has a cage structure.

Figure 3:
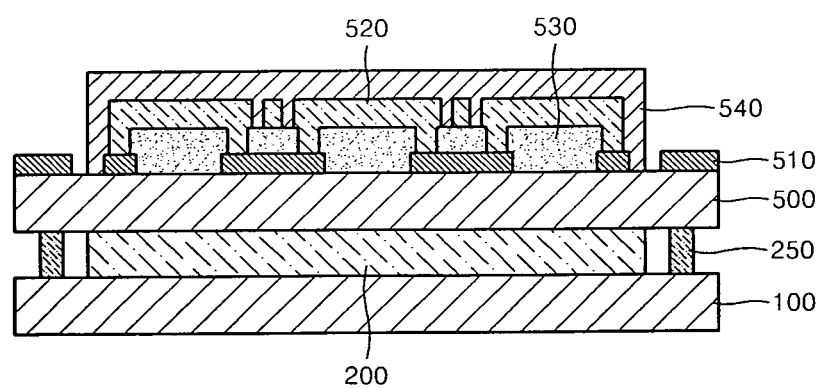
FIG. 3 illustrates a detailed view of a touch unit of an organic light-emitting diode display device, according to an exemplary embodiment.

Hereinafter, the touch unit 300 and the display unit 200 of the organic light-emitting diode display device will now be described in detail. FIG. 3 illustrates a detailed view of the touch unit 300 of an organic light-emitting diode display device, according to an exemplary embodiment.

Referring to FIG. 3, the touch unit 300 may include the encapsulation substrate 500, and first and second conductive layers 510 and 520 formed on the encapsulation substrate 500. For example, the first conductive layer 510, the insulating layer 530, and the second conductive layer 520 are sequentially formed in this stated order on a surface of the encapsulation substrate 500 that opposes the surface facing the substrate 100. In the present embodiment, a separate touch panel may not used and circuit elements may be provided in an on-cell manner on the surface of the encapsulation substrate 500 so as to operate a touch screen on the encapsulation substrate 500. Due to this structure, the thickness of the organic light-emitting diode display device is decreased.

The first conductive layer 510 is formed on the surface of the encapsulation substrate 500 opposite to the surface facing the substrate 100. The insulating layer 530 is formed on the surface of the encapsulation substrate 500 opposite to the surface facing the substrate 100, and covers the first conductive layer 510. For example, the first conductive layer 510 may be formed on the surface opposite to the surface facing the display unit 200 of the encapsulation substrate 500. The insulating layer 530 may insulate the first conductive layer 510 from the second conductive layer 520. A contact hole may be formed in a portion of the insulating layer 530. The second conductive layer 520 may be formed on a surface of the insulating layer 530 opposite to another surface facing the encapsulation substrate 100. In this regard, the second conductive layer 520 is formed filling the contact hole of the insulating layer 530.

The first and second conductive layer 510 and 520 may be formed, each independently of, e.g., Mo, W, Cr, ITO, IZO, ZnO, AZO, or a combination thereof. For example, the first and second conductive layers 510 and 520 may be formed of a transparent material, e.g., ITO, IZO, ZnO, or $In_2O_3$. The first and second conductive layer 510 and 520 may be formed by deposition, spin coating, sputtering, or ink-jetting. For example, the first and second conductive layer 510 and 520 may be formed by sputtering.

A protection layer 540 may be formed on the surface of the insulating layer 530 opposite to the other surface facing the encapsulation substrate 100. The protection layer 540 may cover the second conductive layer 520. The protection layer 540 protects the second conductive layer 320 and insulates the second conductive layer 320 from the display unit 200.

A capacitance pattern may be formed on the surface of the encapsulation substrate 500 of the touch unit 300. Thus, the touch unit 300 is able to be formed to have a reduced thickness and slim etching may be used. The organic light-emitting diode display device may interpret a change in capacitance that occurs when a finger, a conductive subject, or a subject having a high dielectric ratio approaches a surface of the organic light-emitting diode display device, and the display device may detect a touch.

Although not illustrated, the organic light-emitting diode display device may further include a polarizing plate above the touch unit 300. For example, the polarizing plate may polarize light and may be formed on the protection layer 540. When a polarizing plate is used, a contrast ratio may be increased.

Hereinafter, the display unit 200 of the organic light-emitting diode display device will be described in detail.

Figure 4:
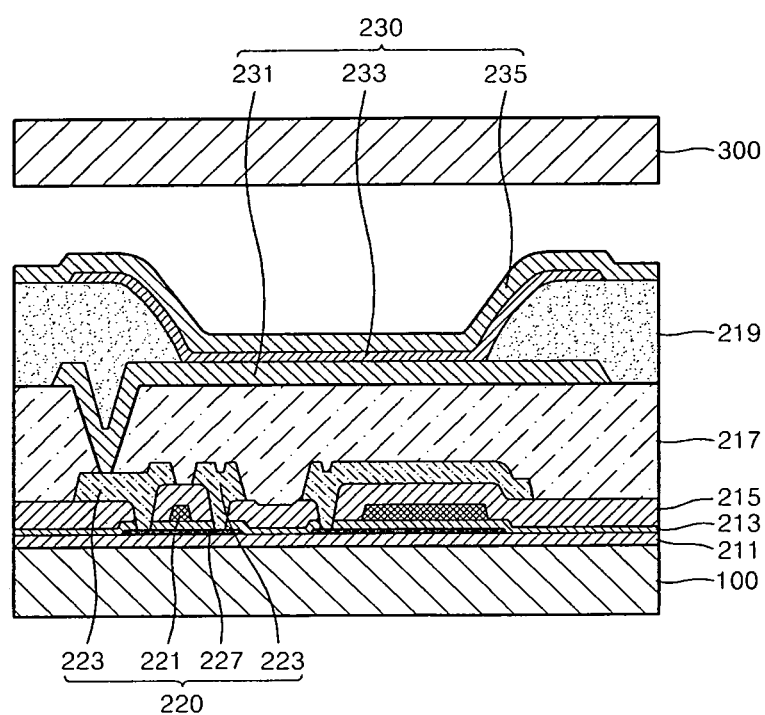
FIG. 4 illustrates a detailed view of a display unit of an organic light-emitting diode display device according to an exemplary embodiment.

FIG. 4 is a schematic sectional view of an organic light-emitting diode display device according to an exemplary embodiment, in which a detailed view of the display unit 200 is exemplarily illustrated.

The display unit 200 includes an emission unit and a non-emission unit, and the first conductive layer, the second conductive layer, and the insulating layer are formed corresponding to the non-emission unit.

Referring to FIG. 4, a plurality of thin film transistors 220 are disposed on the substrate 100, and an organic light-emitting device 230 may be disposed on the thin film transistors 220. The organic light-emitting device 230 may include a pixel electrode 231 electrically connected to the thin film transistors 220, an opposite electrode 235 disposed on the entire surface of the substrate 100, and an intermediate layer 233 that is interposed between the pixel electrode 231 and the opposite electrode 235, and at least one emission layer.

Each of the thin film transistors 220 may be disposed on the substrate 100 and may include a gate electrode 221, source and drain electrodes 223, a semiconductor layer 227, a gate insulating layer 213, and an interlayer insulating layer 215. The thin film transistors 220 may not be limited to the structure illustrated in FIG. 4. For example, when the semiconductor layer 227 is formed of an organic material, the thin film transistor 220 may be an organic thin film transistor, or when the semiconductor layer 227 is formed of silicon, the thin film transistor 220 may be a silicon thin film transistor. If necessary, a buffer layer 211 formed of SiOx or SiNx may be formed between the thin film transistors 220 and the substrate 100.

The organic light-emitting device 230 may include the pixel electrode 231, the opposite electrode 235 facing the pixel electrode 231, and the intermediate layer 233 that is interposed between the pixel electrode 231 and the opposite electrode 235 and is formed of an organic material. The intermediate layer 233 may include at least one emission layer, and may include a plurality of layers. The layers will be described later.

The pixel electrode 231 may function as an anode and the opposite electrode 235 may function as a cathode. In another embodiment, the pixel electrode 231 may function as a cathode and the opposite electrode 235 may function as an anode.

The pixel electrode 231 may be a transparent electrode or a reflective electrode. When the pixel electrode 231 is a transparent electrode, the pixel electrode 231 may be formed of at least one of, e.g., ITO, IZO, ZnO or $In_2O_3$. When the pixel electrode 231 is a reflective electrode, the pixel electrode 231 may include a reflective layer formed of, e.g., Ag, Mg, Al, Pt, Pd, Au, Ni, Nd, Ir, Cr, or a mixture thereof and a layer formed of ITO, IZO, ZnO or $In_2O_3$, wherein the layer is formed on the reflective layer.

Likewise, the opposite electrode 235 may be a transparent electrode or a reflective electrode. When the opposite electrode 235 is a transparent electrode, the opposite electrode 235 may include a layer that is formed of Li, Ca, LiF/Ca, LiF/Al, Al, Mg, or a mixture thereof and is formed toward the intermediate layer 233 interposed between the pixel electrode 231 and the opposite electrode 235, and may include an auxiliary electrode or a bus electrode line formed on the layer. Wherein the auxiliary electrode and the bus electrode line may be formed of a material for forming a transparent electrode and examples of the material include, e.g., ITO, IZO, ZnO, and $In_2O_3$. When the opposite electrode 235 is a reflective electrode, the opposite electrode 235 may be formed by depositing Li, Ca, LiF/Ca, LiF/Al, Al, Mg, or a mixture thereof.

Meanwhile, a pixel defining layer (PDL) 219 covers an edge of the pixel electrode 231 and has a given thickness outside the pixel electrode 231. The PDL 219 may, as well as define an emission region, widen an interval between the edge of the pixel electrode 231 and the opposite electrode 235 so as to minimize, reduce, and/or prevent, an electric field to be focused on the edge of the pixel electrode 231. Thus, reducing the potential of and/or preventing a short-circuiting of the pixel electrode 231 and the opposite electrode 235.

The intermediate layer 233, including at least an emission layer, may be disposed between the pixel electrode 231 and the opposite electrode 235. The intermediate layer 233 may be formed of a low molecular weight organic material or a polymer organic material.

When the intermediate layer 233 is formed of a low molecular weight organic material, the intermediate layer 233 may include, e.g., a hole injection layer (HIL), a hole transport layer (HTL), an organic emission layer (EML), an electron transport layer (ETL), and an electron injection layer (EIL), each of which may have a mono-layer structure or a multi-layer structure. In this regard, an available organic material may be, e.g., copper phthalocyanine (CuPc), N,N'-Di naphthalene-1-yl-N,N'-diphenyl-benzidine (NPB), or tris-8-hydroxyquinoline aluminum ($Alq_3$). These low molecular weight organic materials may be vacuum deposited to form a layer.

When the intermediate layer 233 is formed of a polymer organic material, the intermediate layer 233 may include a HTL and an EML. In this regard, the HTL may include, e.g., PEDOT, and the EML may include, e.g., at least one of poly-phenylenevinylene (PPV) and polyfluorene.

The organic light-emitting device 230 may be electrically connected to the thin film transistors 220 disposed under the organic light-emitting device 230. In this regard, when the thin film transistors 220 are covered by a planarization layer 217 having a contact hole therein, the organic light-emitting device 230 is disposed on the planarization layer 217 and the pixel electrode 231 of the organic light-emitting device 230 may be electrically connected to the thin film transistors 220 through the contact hole of the planarization layer 217.

The organic light-emitting device 230 formed on the substrate 100 may be sealed by the encapsulation substrate 500. As described above, the encapsulation substrate 500 may be formed of, e.g., glass or plastic. In addition, as described above, the first conductive layer 510, the second conductive layer 520, and the insulating layer 530 are formed on the surface of the encapsulation substrate 500 and constitute a touch unit.

A method of manufacturing the organic light-emitting diode display device, according to an exemplary embodiment, includes forming the display unit 200 on the substrate 100, forming the first conductive layer 510 on the encapsulation substrate 500, forming the insulating layer 530 on at least a portion of the first conductive layer 510 and the encapsulation substrate 500, forming the second conductive layer 520 on at least a portion of the first conductive layer 510 and the insulating layer 530, coating and sintering glass frit on the encapsulation substrate 500, and coupling the substrate 100 to the encapsulation substrate 500. The first and second insulating layers 510 and 520 may be formed by coating the organosilicon compound of Formula 1 on the encapsulation substrate 500 and heat treating the coating layer at a temperature of about 200 to 400° C. The heat treating temperature may be a narrower range, e.g., the narrower range may include, but is not limited to, about 250 to 400° C. and about 300 to 400° C.

Hereinafter, the manufacturing method will be described in detail.

First, the display unit 200 may be formed on the substrate 100, and separately, the first conductive layer 510, the insulating layer 530, and the second conductive layer 520 may be formed on the encapsulation substrate 500. The first conductive layer 510 may be formed by sputtering, e.g., Mo, W, Cr, ITO, IZO, ZnO, AZO, $In_2O_3$, or a combination thereof. The insulating layer 530 may be formed by spin coating or slit coating a solution prepared by mixing the organosilicon compound of Formula 1 with an acid and heat treating the coating layer at a temperature of about 250° C. When a photosensitive material is used, a lithography process may be performed directly after pre-baking, and when a non-photosensitive material is used, a photoresist (PR) may be coated after the pre-baking and then a lithography process is performed and thereafter post-baking is performed. Likewise the first conductive layer 510, the second conductive layer 530 may be formed by sputtering, e.g., Mo, W, Cr, ITO, IZO, ZnO, AZO, $In_2O_3$, or a combination thereof.

A sealing portion including glass frit is formed on an edge of the encapsulation substrate 500. For example, glass frit may be coated and then the coated glass frit may be sintered. The glass frit may be sintered at a temperature of 300 to 500° C. During the sintering, the insulating layer 530 included in the touch unit 300 has a high heat resistance and may not thermally decompose in the sintering temperature range described above.

Next, the substrate 100 and the encapsulation substrate 500 are sealed. The sealing process may include coupling the substrate 100 and the encapsulation substrate 500 by melting the sealing portion 250 by irradiation of a laser or ultraviolet rays.

Example 1

A solution including an organosilicon compound represented by Formula 3 below wherein R is H and a hydrochloric acid (about 37 weight (wt.)%: HCl) in a mole ratio of about 1:0.01 was spin coated under an atmospheric condition on an encapsulation substrate on which a transparent conductive layer formed of ITO was formed, thereby forming a layer having a thickness of about 1 μm. The spin coating was performed at about 1,000 RPM. The coated encapsulation substrate was heat treated at a temperature of about 220° C. in a sintering furnace for about 1 hour so as to form an insulating layer. The encapsulation substrate was patterned by photolithography and dry-wetting and then treated using a conventional method, thereby completing manufacturing of a touch unit.

<Formula 3>

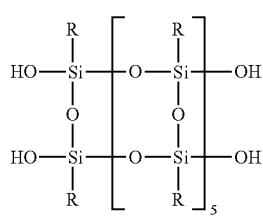

Glass frit was coated on an edge of the encapsulation substrate and sintered at a temperature of about 350° C. Then the resultant encapsulation substrate was coupled to a separate substrate including a display unit, thereby completing the manufacturing of an organic light-emitting diode display device. Regarding to the organic light-emitting diode display device, whether a sealing portion was formed, a thermal decomposition temperature, a visible light transmittance, a dielectric ratio, and a hardness of the insulating layer were measured.

Example 2

A solution including an organosilicon compound represented by Formula 3 wherein R is $CH_3$ and a hydrochloric acid (about 37 weight (wt.)%: HCl) in a mole ratio of about 1:0.01 was spin coated under an atmospheric condition on an encapsulation substrate on which a transparent conductive layer formed of ITO was formed, thereby forming a layer having a thickness of about 1 μm. The spin coating was performed at about 1,000 RPM. The coated encapsulation substrate was heat treated at a temperature of about 220° C. in a sintering furnace for about 1 hour so as to form an insulating layer. The encapsulation substrate was patterned by photolithography and dry-wetting and then treated using a conventional method, thereby completing manufacturing of a touch unit.

Glass frit was coated on an edge of the encapsulation substrate and sintered at a temperature of about 350° C. Then the resultant encapsulation substrate was coupled to a separate substrate including a display unit, thereby completing the manufacturing of an organic light-emitting diode display device. Regarding to the organic light-emitting diode display device, whether a sealing portion was formed, a thermal decomposition temperature, a visible light transmittance, a dielectric ratio, and a hardness of the insulating layer were measured.

Example 3

A solution including an organosilicon compound represented by Formula 3 wherein R is $C_2H_5$ and a hydrochloric acid (about 37 weight (wt.)%: HCl) in a mole ratio of about 1:0.01 was spin coated under an atmospheric condition on an encapsulation substrate on which a transparent conductive layer formed of ITO was formed, thereby forming a layer having a thickness of about 1 μm. The spin coating was performed at about 1,000 RPM. The coated encapsulation substrate was heat treated at a temperature of 220° C. in a sintering furnace for about 1 hour so as to form an insulating layer. The encapsulation substrate was patterned by photolithography and dry-wetting and then treated using a conventional method, thereby completing manufacturing of a touch unit.

Glass frit was coated on an edge of the encapsulation substrate and sintered at a temperature of about 350° C. Then the resultant encapsulation substrate was coupled to a separate substrate including a display unit, thereby completing the manufacturing of an organic light-emitting diode display device. Regarding to the organic light-emitting diode display device, whether a sealing portion was formed, a thermal decomposition temperature, a visible light transmittance, a dielectric ratio, and a hardness of the insulating layer were measured.

Example 4

A solution including an organosilicon compound represented by Formula 3 wherein R is $C_3H_7$ and a hydrochloric acid (about 37 weight (wt.)%: HCl) in a mole ratio of about 1:0.01 was spin coated under an atmospheric condition on an encapsulation substrate on which a transparent conductive layer formed of ITO was formed, thereby forming a layer having a thickness of about 1 μm. The spin coating was performed at about 1,000 RPM. The coated encapsulation substrate was heat treated at a temperature of about 220° C. in a sintering furnace for about 1 hour so as to form an insulating layer. The encapsulation substrate was patterned by photolithography and dry-wetting and then treated using a conventional method, thereby completing manufacturing of a touch unit.

Glass frit was coated on an edge of the encapsulation substrate and sintered at a temperature of about 350° C. Then the resultant encapsulation substrate was coupled to a separate substrate including a display unit, thereby completing the manufacturing of an organic light-emitting diode display device. Regarding to the organic light-emitting diode display device, whether a sealing portion was formed, a thermal decomposition temperature, a visible light transmittance, a dielectric ratio, and a hardness of the insulating layer were measured.

TABLE 1

| R | Formation of sealing portion | Thermal decomposition temperature of the insulating layer (° C.) | Visible light transmittance of the insulating layer (%) | Dielectric ratio of the insulating layer | Shore hardness of the insulating layer |
|---|---|---|---|---|---|
| Example 1 —H | yes | 450 | 99 | 3.0 | D94 |
| Example 2 —CH$_3$ | yes | 380 | 96 | 3.1 | D92 |
| Example 3 —C$_2$H$_5$ | yes | 360 | 95 | 3.2 | D91 |
| Example 4 —C$_3$H$_7$ | yes | 360 | 95 | 3.2 | D91 |

Referring to Table 1, the organic light-emitting diode display devices manufactured according to Examples 1 to 4 have excellent sealing portion formation characteristics. In addition, the insulating layers used in the touch units of the organic light-emitting diode display devices manufactured according to Examples 1 to 4 have a high heat resistance, a high visible light transmittance, a low dielectric ratio, and high shore hardness.

The organic light-emitting diode display devices according to above exemplary embodiments are manufactured by sealing with glass frit and may have, e.g., a long lifetime and a high yield.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting diode display device comprising:
   a substrate;
   a display unit on the substrate;
   a touch unit facing the substrate; and
   a sealing portion surrounding the display unit, the sealing portion coupling the substrate to the touch unit and including glass frit, wherein:
   the touch unit includes an encapsulation substrate, a first conductive layer on a surface of the encapsulation substrate, an insulating layer on at least a portion of the first conductive layer and the encapsulation substrate, and a second conductive layer on at least a portion of the first conductive layer and the insulating layer;
   a thermal decomposition temperature of the insulating layer is about 360° C. or more; and
   the insulating layer includes an organosilicon compound represented by Formula 1:

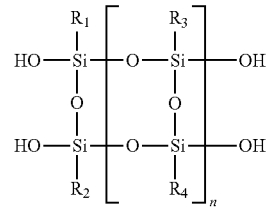

wherein n is an integer from 1 to 7, and $R_1$ through $R_4$ are each independently one of H, $CH_3$, $C_2H_5$, or $C_3H_7$.

2. The organic light-emitting diode display device as claimed in claim 1, wherein a visible light transmittance of the insulating layer is about 95% or more.

3. The organic light-emitting diode display device as claimed in claim 1, wherein a dielectric ratio of the insulating layer is about 3.3 or less.

4. The organic light-emitting diode display device as claimed in claim 1, wherein a shore D hardness of the insulating layer is in the range of about 90 to about 95.

5. The organic light-emitting diode display device as claimed in claim 1, wherein in Formula 1, at least one of $R_1$ to $R_4$ is a hydrogen atom.

6. The organic light-emitting diode display device as claimed in claim 1, wherein the organosilicon compound is represented by Formula 2:

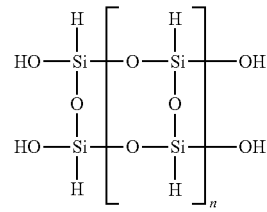

wherein n is an integer from 1 to 7.

7. The organic light-emitting diode display device as claimed in claim 1, wherein a thermal decomposition temperature of the insulating layer is about 400° C. or more, and the organosilicon compound is represented by Formula 2:

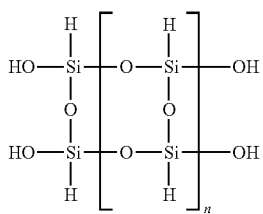

wherein n is an integer from 1 to 7.

8. The organic light-emitting diode display device as claimed in claim 7, wherein a visible light transmittance of the insulating layer is about 97% or more.

9. The organic light-emitting diode display device as claimed in claim 1, wherein the first conductive layer and the second conductive layer each include at least one of Mo, W, Cr, ITO, IZO, ZnO, AZO, and $In_2O_3$.

10. The organic light-emitting diode display device as claimed in claim 1, wherein the first conductive layer is on one surface of the encapsulation substrate opposite to another surface of the encapsulation substrate facing the display unit.

11. The organic light-emitting diode display device as claimed in claim 1, wherein the display unit includes an emission unit, and a non-emission unit, the first conductive layer, the second conductive layer, and the insulating layer correspond to the non-emission unit.

12. The organic light-emitting diode display device as claimed in claim 1, wherein the display unit includes thin film transistors on the substrate and a light-emitting device coupled to the thin film transistors, the light-emitting device including a first electrode, a second electrode, and an organic layer interposed between the first electrode and the second electrode.

13. The organic light-emitting diode display device as claimed in claim 1, wherein the touch unit is an electrostatic capacity type touch unit.

14. The organic light-emitting diode display device as claimed in claim 1, further comprising a polarizing plate disposed on the touch unit.

15. The organic light-emitting diode display device as claimed in claim 1, wherein the organic light-emitting diode display device is a front emission type organic light-emitting diode display device.

* * * * *